United States Patent [19]

Bijvoets

[11] Patent Number: 5,006,178

[45] Date of Patent: Apr. 9, 1991

[54] THERMO-ELECTRIC DEVICE WITH EACH ELEMENT CONTAINING TWO HALVES AND AN INTERMEDIATE CONNECTOR PIECE OF DIFFERING CONDUCTIVITY

[76] Inventor: Theodorus Bijvoets, Joh. Strausslaan 36, 5583 XX Waaire, Netherlands

[21] Appl. No.: 344,335

[22] Filed: Apr. 27, 1989

[30] Foreign Application Priority Data

Apr. 27, 1988 [NL] Netherlands ................. 8801093

[51] Int. Cl.⁵ .................................... H01L 35/28
[52] U.S. Cl. .................................. 136/211; 136/203; 136/212; 136/225; 136/227; 136/242
[58] Field of Search ............... 136/203, 204, 205, 211, 136/212, 224, 225, 226, 227, 222, 230, 241, 242

[56] References Cited

U.S. PATENT DOCUMENTS

| | | | |
|---|---|---|---|
| 2,992,539 | 7/1961 | Curtis | 62/3 |
| 3,377,206 | 4/1968 | Hänlein et al. | 136/212 |
| 3,648,470 | 3/1972 | Schultz | 62/3 |
| 4,459,428 | 7/1984 | Chou | 136/211 |
| 4,465,895 | 8/1984 | Verner et al. | 136/225 |

FOREIGN PATENT DOCUMENTS 0160433 4/1985 European Pat. Off. ............ 35/32

Primary Examiner—Peter A. Nelson
Assistant Examiner—C. D. Carroll
Attorney, Agent, or Firm—Skjerven, Morrill, MacPherson, Franklin & Friel

[57] ABSTRACT

Thermoelectric device having a number of thermoelectric elements electrically connected in series and thermally connected in parallel. Each element is provided with two element halves, electrically connected in series and thermally connected in parallel, of opposite conductivity types. Each element half has two semiconducting end pieces and an electrically conducting intermediate piece which are electrically connected in series.

10 Claims, 1 Drawing Sheet

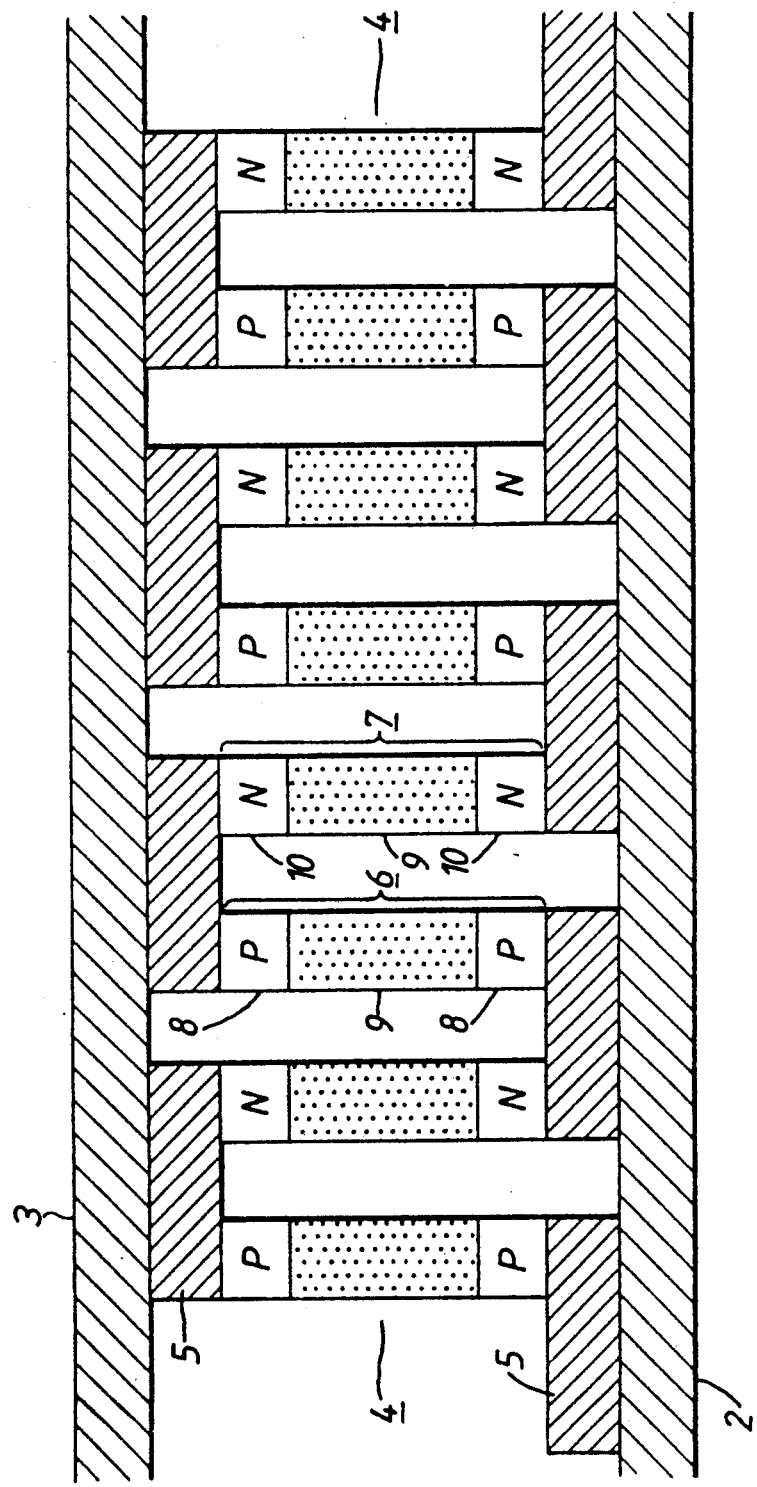

THERMO-ELECTRIC DEVICE WITH EACH ELEMENT CONTAINING TWO HALVES AND AN INTERMEDIATE CONNECTOR PIECE OF DIFFERING CONDUCTIVITY

The invention relates to a thermoelectric device comprising a number of thermoelectric elements electrically connected in series and thermally connected in parallel, said thermoelectric elements each being provided with two element halves, electrically connected in series and thermally connected in parallel, of opposite conductivity types.

Such a device is known from "Direct Energy Conversion" by M. Ali Kettany, Addison-Wesley Publishing Company, Reading, Mass., U.S.A., 1970, p. 157.

With the known device the element halves consist of bars of a semi-conducting material.

In practice the thermoelectric elements need not be arranged in a row, but they can be arranged in a matrix, whilst several thermoelectric devices can be thermally connected in series or in cascade, in order to enhance the effects aimed at, such as cooling.

The known device has a number of disadvantages, a few of which will be discussed below.

In general the thermoelectric elements are enclosed between two parallel plates which are spaced from each other by a relatively small distance. When the device is in operation the one plate will become cold and the other plate will become hot. Apart from the thermoelectric effects the two plates, which are indeed spaced from each other by a small distance, will influence each other, as a result of which the hot plate will become colder and the cold plate will become hotter, which decreases the efficiency of the thermoelectric device.

The current flowing during operation of the device causes joule heat in the element halves, also resulting in a reduction in efficiency.

It is emphasized that said efficiency reductions occur both when the device is used thermally and when the device is used electrically.

The former disadvantage might be lessened by making the element halves longer, but this would only enhance the latter disadvantage.

The object of the invention is to remove the disadvantages of the known thermoelectric device and this object is accomplished by a device of the kind referred to in the preamble, which is characterized in that each element half has two semiconducting end pieces and an electrically conducting intermediate piece which are electrically connected in series.

The invention is based on the perception that thermoelectric effects in a semiconductor junction substantially take place in the enhancement and depletion areas of free electrons, so that in principle not much more semiconducting material is required than of the size of said areas, and that the semiconductor junctions can be connected together by means of conductors, possibly having a number of shapes and sections, which conductors have a negligible thermoelectric effect relative to the semiconductor junctions and, because they have a negligible resistance, generate hardly any joule heat. This makes it possible to space the aforesaid plates from each other by a larger distance. This spacing does not have to be parallel, since the intermediate pieces according to the invention may be flexible, whereby the end pieces, respectively associated with one of the plates, remain thermally connected in parallel. Also it is possible, by the choice of the length of the intermediate pieces, to give at least one of the plates a certain profile or a desired shape. A temperature gradient may be applied across the plates by suitable selection of the material and the shape of the intermediate pieces, thus the intermediate pieces may be of different materials.

A suitable material for the intermediate piece is copper, which is a good electric conductor.

Theoretically a material is to be preferred which has a high electric conductivity but a low thermal conductivity, but it is emphasized that in practice the advantage offered by the excellent electric conductivity offsets having a high thermal conductivity, instead of the desired low thermal conductivity.

In this connection it is useful to note that the thermal conductivity of metals can already be significantly reduced by lightly doping. Thus a trace of arsenic in copper reduces the thermal conductivity by a factor of 3.

According to the invention the length of the intermediate piece can be chosen substantially longer than that of the end pieces.

It is furthermore noted that from EP-A-O 160 433 it is known per se to respectively place the element halves on pedestals of a material having good electric and thermal conducting properties, such as copper. In fact part of the semiconducting material in this known device has been replaced by conducting material, as a result of which semiconducting material is saved and the negative influencing of the efficiency by the joule heat is decreased, as is the case with the invention. Because, however, the difference in temperature must be across the semiconducting material of the element halves, the pedestals must have a high thermal conductivity. With a reduction in the losses caused by joule heat the thermal resistance between the cold and the hot side also decreases, since it is directly proportional to the length of the semiconductor part of the element halves. Summarizing, the first disadvantage mentioned in the preamble is not removed by this known device.

Put differently and summing up, according to the present invention the conventional element half of semiconducting material of the P-type or the N-type has been replaced by a possibly longer semiconducting element half having a lower effective resistance and preferably a high thermal resistance.

The invention will be further explained hereinafter, insofar as necessary, with reference to the drawing which consists of a single FIGURE diagrammatically illustrating an embodiment of the device according to the invention.

The FIGURE diagrammatically indicates a partial section of a thermoelectric device according to the invention. The thermoelectric elements 4 are electrically connected in series by means of the bridges 5. Furthermore the thermoelectric elements 4 are thermally connected in parallel between two plates 2 and 3 which consist of a material which is electrically insulating and thermally conducting.

Apart from the bridges 5 each thermoelectric element 4 comprises two element halves 6 and 7 respectively. In the figure the element half 6 consists of two semiconducting end pieces 8 of the P conductivity type and an intermediate piece 9, connected therebetween, of a material having a good electric conductivity and preferably a low thermal conductivity. Element half 7 likewise comprises an intermediate piece 9 of a material which has a good electric conductivity and preferably a low thermal conductivity, but in this case it comprises two semiconducting end pieces 10 of the N conductivity type. Put differently, each element half 6, 7 has two semiconducting end pieces 8,8, 10,10 and an electrically conducting intermediate piece 9,9, which are electrically connected in series.

Because a P-conducting end piece 8 and an N-conducting end piece 10 are respectively connected at each bridge 5, the enhancement or depletion process of free electrons mentioned above will take place in the bridges 5 with the passage of current. As a result thermoelectric effects are created in the bridges 5, therefore.

At both ends of the intermediate pieces 9 there is semiconducting material of the same conductivity type and there will be at least substantially no enhancement or depletion process. As a result hardly any or no thermoelectric effects at all are created in the intermediate pieces 9, therefore.

The constructional difference between the thermoelectric device according to the invention and the conventional one is that in the latter case the intermediate piece 6, 7 is of the same semiconductor material as that of the end pieces 8,8 10,10.

For the thermoelectric effect there can be written:

$$W_1 = P \cdot I \qquad (1),$$

in which
$W_1$ = quantity of heat transported;
P = Peltier coefficient; and
I = electric current through the thermoelectric device.

For the joule heat there can be written:

$$W_2 = I^2 \cdot \rho \cdot L \cdot A^{-1} \qquad (2),$$

in which
$W_2$ = joule heat;
I = electric current through the thermoelectric device;
$\rho$ = specific resistance of the element half;
L = length of the element halves;
A = diameter of the element halves.

For the thermal conduction losses there can be written:

$$W_3 = \Delta T \cdot K \cdot A \cdot L^{-1} \qquad (3),$$

in which
$W_3$ = quantity of heat transported;
$\Delta T$ = difference in temperature across the thermoelectric device;
K = specific thermal conductivity of the element halves;
A = diameter of the element halves;
L = length of the element halves.

From equation (1) it appears that when the device is used as a cooling device the difference in temperature $\Delta T$ across the device is directly proportional to the Peltier coefficient P and to the electric current I through the device, and when the device is used as an electric generator the electric current I (short-circuit current) is directly proportional to the difference in temperature $\Delta T$ across the device with a given Peltier coefficient P.

From equation (2) it appears that when the device is used as a cooling device the losses $W_2$ increase quadratically with the electric current I, so that the efficiency reduces. Said losses $W_2$ can be made small by seeing to it that the resistance $R = \rho \cdot L \cdot A^{-1}$ is small. For the usual element halves a semiconductor material is used, in view of the high Peltier coefficient P, so that with a given construction the specific resistance $\rho$ is fixed, so that then only the length L and the diameter A of the element halves can be set optimally.

From equation (3) it appears that when the device is used as a cooling device the losses $W_3$ increase as a function of the difference in temperature $\Delta T$ across the device. The specific thermal conductivity K is fixed once the semiconductor material has been selected, so that an optimum can only be set by a suitable choice of the length L and the diameter A of the element halves, whereby it is noted that the conditions for optimizing the losses $W_2$ and $W_3$ are opposite.

According to the invention, however, intermediate pieces 9 are used which, dependent on the conductivity type of the end pieces 8 or 10, will behave as P-type or N-type material. The material of the intermediate pieces 9 is thereby selected on the basis of the specific thermal conductivity K and the specific resistance $\rho$, not on the basis of a high Peltier coefficient P, therefore, as is the case according to the prior art.

The thickness of the end pieces 8, 10 is in the order of magnitude of several $\mu m$ and they may consist of the usual semiconductor material, such as BiTe. Said thickness of the layer is about 0.1% of the conventional length of the element half, as a result of which the losses $W_2$ of joule heat of the semiconductor material are reduced by the same order of magnitude.

The material of the intermediate pieces 9 must be selected at values of the specific resistance $\rho$ and the specific thermal conductivity K which are as advantageous as possible. Hereinafter the specific resistance and the specific thermal conductivity of the semiconductor material will be indicated by $\rho_h$ and $K_h$ respectively, and those of the material of the intermediate pieces 9 by $\rho_t$ and $K_t$ respectively. Supposing there is a material for the intermediate pieces 9, for which $\rho_t = r \cdot \rho_h (r < 1)$ holds, then $K_t = K_h \cdot r^{-1}$, is applicable, if the same losses $W_2$ are allowed in the device at the element halves 6, 7, from which it follows $$\rho_t \cdot K_t^{-1} = r \cdot \rho_h \cdot (K_h \cdot r^{-1})^{-1} = r^2 \cdot \rho_h \cdot K_h^{-1} \qquad (4)$$

From the equation (4) it appears that the smaller the value of the ratio between the specific resistance $\rho$ and the specific resistance K of a material, the more the losses $W_2$ are reduced. Said ratio will be called the Z-value hereinafter. Experiments have shown that the Z-value for BiTe is equal to 1.46. The Z-values for silver, copper and an alloy containing 90% platinum and 10% iridium are $1.7 \cdot 10^{-5}$, $1.7 \cdot 10^{-5}$ and $3.2 \cdot 10^{-4}$ ($\Omega \cdot s \cdot cal^{-1}$), respectively. The three latter Z-values are dozens of times better than those of BiTe. From this it follows that copper and silver are to be preferred, but there are indications that certain alloys of copper produce a better Z-value, whilst it is still to be investigated whether there are materials which have even better Z-values. In any case the specific thermal conductivity K can be reduced with a factor of 3 by lightly doping with arsenic.

Also the intermediate pieces 9 may have two or more constituent pieces of different materials, e.g. constituent pieces of a material having a high Z-value and a short length because of a high resistance, such as a nickel-iron alloy at the end pieces 8, 10 and a constituent piece having a longer length and a low resistance, but a lower Z-value therebetween.

EXAMPLE I

In a provisional manner a prototype of the device according to the invention was made comprising copper intermediate pieces 9 and BiTe end pieces 8, 10, whereby the end pieces had a length of about 2.5 mm and the intermediate pieces a length of 15 mm. In this prototype an efficiency was measured which was three times as high as that of a comparable standard thermoelectric device at a difference in temperature $\Delta T$ across the device of 80K.

EXAMPLE II

The same as Example I, but instead of copper bars for the intermediate pieces 9 flexible copper wires having a length of about 500 mm. Also this device confirmed the operation according to the invention.

Increasing the efficiency of the thermoelectric device according to the invention makes it possible to reach lower temperatures than was possible before, when a number of thermoelectric devices, e.g. five, are connected in cascade, whereby in the case mentioned, with an efficiency improvement with a factor of 3 per device, the total efficiency is improved with a factor of $3^5 = 243$.

In order to transport 1 W of heat with the conventional thermoelectric device, which is often called Peltier element, at a temperature of 150K a cascade circuit of 8 Peltier elements is needed and a power of 7 kW must be supplied to the circuit. With the thermoelectric device according to the invention for example a cascade circuit of 6 elements may be used, whereby a power input of only $7 \cdot 10^3 \cdot 3^{-6} \approx 10$ W will be necessary.

Summarizing, the present thermoelectric device can be used with Peltier elements, irrespective of its application as a cooling or as a heating element, or as a thermoelectric generator. The intermediate pieces 9 may be rigid or flexible and may have various forms and sections. When they are flexible the (hot and cold) plates 2, 3 need not be parallel to each other.

The parameters to which the material of the intermediate pieces 9 must be selected are:
a specific electric resistance $\rho$ as low as possible; and
a specific thermal conductivity K as low as possible; and
a Z-value, i.e. the ratio between specific electric resistance $\rho$ and specific thermal conductivity K as low as possible.

The end pieces 8, 10 may be made very short.

Because of the increased efficiency low temperatures can be achieved in an attractive manner, which low temperatures could not be reached by means of Peltier elements up to now. The cooling of germanium detectors for measuring $\gamma$-radiation, fast electronic circuits, superconductors, infrared detectors and refrigerators for whatever applications can be thought of hereby.

When the thermoelectric device is used as a thermoelectric generator the efficiency improvement produces analogous advantages.

What is claimed is:

1. A thermoelectric device comprising a number of thermoelectric elements electrically connected in series and thermally connected in parallel, said thermoelectric elements each being provided with two element halves, electrically connected in series and thermally connected in parallel, of opposite conductivity types, characterized in that each element half has two semiconducting end pieces and an electrical conductivity intermediate piece of differing electrical conductivity which are electrically connected in series.

2. The thermoelectric device according to claim 1, characterized in that the electrically conducting intermediate piece consists of a metal doped for reducing the thermal conductivity.

3. The thermoelectric device according to claim 1, characterized in that the intermediate piece is thermally insulating.

4. The thermoelectric device according to any of claims 1-3, characterized in that the length of the intermediate piece is substantially longer than that of the end pieces.

5. The thermoelectric device according to any of claims 1-3, characterized in that the intermediate piece is flexible.

6. The thermoelectric device according to any of claims 1-3, characterized in that the intermediate piece has at least two constituent pieces of different materials.

7. The thermoelectric device according to claim 6, characterized in that it has intermediate pieces having a predetermined longitudinal division.

8. The thermoelectric device according to claim 4, characterized in that it has intermediate pieces of at least two different materials.

9. The thermoelectric device according to claim 6, characterized in that the combined length of said constituent pieces is substantially longer than that of said end pieces.

10. The thermoelectric device according to claim 5, characterized in that said intermediate piece is substantially longer than that of said end pieces.

* * * * *